United States Patent
Seyama

(10) Patent No.: US 7,735,707 B2
(45) Date of Patent: Jun. 15, 2010

(54) WIRE BONDING APPARATUS

(75) Inventor: Kohei Seyama, Fussa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 11/827,706

(22) Filed: Jul. 13, 2007

(65) Prior Publication Data

US 2008/0011809 A1    Jan. 17, 2008

(30) Foreign Application Priority Data

Jul. 13, 2006    (JP)    ............................. 2006-192669

(51) Int. Cl.
*B23K 37/00*    (2006.01)
*B23K 20/10*    (2006.01)

(52) U.S. Cl. ...................... 228/4.5; 228/1.1; 228/110.1; 228/180.5

(58) Field of Classification Search ................. 228/1.1, 228/4.5, 45, 110.1, 123.1, 179.1, 180.5, 904
See application file for complete search history.

(56) References Cited

U.S. PATENT DOCUMENTS

| | | | |
|---|---|---|---|
| 4,815,453 A | * | 3/1989 | Cotrel .......................... 606/261 |
| 4,854,494 A | * | 8/1989 | von Raben ................... 228/102 |
| 5,314,105 A | * | 5/1994 | Farassat ....................... 228/102 |
| 5,890,643 A | * | 4/1999 | Razon et al. .................. 228/1.1 |
| 6,425,514 B1 | | 7/2002 | Ou et al. |
| 6,513,696 B1 | * | 2/2003 | Ho et al. ...................... 228/4.5 |

FOREIGN PATENT DOCUMENTS

JP    2003-258021    9/2003

OTHER PUBLICATIONS

Definition of "within": http://dictionary.reference.com/browse/within.*

* cited by examiner

*Primary Examiner*—Jessica L. Ward
*Assistant Examiner*—Kevin E Yoon
(74) *Attorney, Agent, or Firm*—William L. Androlia; H. Henry Koda

(57) ABSTRACT

A wire bonding apparatus including a bonding arm provided at a tip end thereof with an ultrasonic horn that has a capillary at its tip end, wherein the bonding arm is provided therein with a pressure sensor that detects the pressing load applied by the capillary on a workpiece when bonding is executed. The bonding arm has a supporting point which is a thin-connecting portion and located at a height which is the same as the height of the center of gravity of a part formed by the capillary, ultrasonic horn body portion, ultrasonic vibrator, ultrasonic horn connecting portion, etc., and at a point where a balance between inertial mass including the capillary, ultrasonic horn body part, ultrasonic horn connecting portion, horn securing screws and pressure screws and inertial mass of the ultrasonic vibrator is maintained, when the bonding arm is turned about a bonding arm supporting shaft.

6 Claims, 6 Drawing Sheets

WIRE BONDING APPARATUS

BACKGROUND OF THE INVENTION

The present invention relates to wire bonding apparatuses and more particularly to a wire bonding apparatus that includes a pressure sensor for detecting a pressing load of a capillary.

In the apparatus of Japanese Patent Application Unexamined Publication Disclosure No. 2003-258021, as shown in FIG. 6, an ultrasonic horn 1 is held by a bonding arm 5, and a pressure sensor 10 is provided at a part where the ultrasonic horn and the bonding arm are connected. In the apparatus of U.S. Pat. No. 6,425,514, as shown in FIG. 7, a transducer (ultrasonic horn) 1 is held by a transducer holder 100 at one end of the bonding arm 5, and another end of the bonding arm 5 is secured to a bond body 104 of the bonding apparatus driven by an actuator 106. Further, a pressure sensor 10 is provided in a recess part, which is inside the horn holder 100 of the bonding arm 5, so that the pressure sensor 10 with a spring washer 102 is sandwiched by the horn holder 100 and the bond body 104.

In the apparatus of Japanese Patent Application Unexamined Publication Disclosure No. 2003-258021, as seen from FIG. 6, the pressure sensor 10 is provided at a part where the ultrasonic horn 1 and the bonding arm 5 are connected. Accordingly, when replacing the ultrasonic horn 1, the pressure sensor 10 must also be removed from the bonding arm 5. For this reason, every time the ultrasonic horn is replaced, disassembly, reassembly, and load calibration of the pressure sensor are required. Thus, working performance is poor.

Moreover, in both apparatuses of Japanese Patent Application Unexamined Publication Disclosure No. 2003-258021 and U.S. Pat. No. 6,425,514, the position where the pressure sensor is provided is limited because the pressure sensor is provided between component parts that have different functions. Accordingly, there is little mechanism design freedom, and the magnification factor for the capillary pressing load detected by the pressure sensor is limited.

BRIEF SUMMARY OF THE INVENTION

The first object of the present invention is to provide a wire bonding apparatus which is allowed with a great deal of mechanism design freedom and in which the magnification factor (ratio) for the capillary pressing load detected by a pressure sensor can be set freely.

The second object of the present invention is to provide a wire bonding apparatus that is free of works such as removal, installation (reinstallation), and load calibration and the like of the pressure sensor at the time that an ultrasonic horn is, for instance, replaced.

The above objects are accomplished by a unique structure of the present invention for a wire bonding apparatus that includes:

an ultrasonic horn including a capillary part, an ultrasonic vibrator part, and an ultrasonic horn body portion,
the ultrasonic horn body portion being securely-fixed to the capillary part at one end thereof and to the ultrasonic vibrator part at another end thereof;
a bonding arm including an ultrasonic horn-connecting portion for fixing securely the ultrasonic horn thereto;
a bonding arm body portion provided between the ultrasonic horn-connecting portion and an arm supporting shaft therefor; and
a pressure sensor for detecting a pressing load applied by the capillary part, the pressure sensor being provided within the bonding arm.

In the bonding apparatus of the present invention, the bonding arm is formed with a sensor hole(s) in an upper surface thereof so as to have the pressure sensor(s) therein, and the pressure sensor(s) provided in the sensor hole(s) is secured by a pressure screw(s) to the bonding arm.

Furthermore, in the wire bonding apparatus of the present invention, the bonding arm is formed with a sensor hole(s) in a side surface(s) thereof so as to have the pressure sensor(s) therein; and the pressure sensor(s) provided in the sensor hole(s) is secured by a pressure screw(s) to the bonding arm.

In addition, in the wire bonding apparatus of the present invention, the pressure screw(s) is a different member from the horn securing screw(s) that secures the ultrasonic horn to the bonding arm.

In the present invention, the pressure screw(s) function also as a horn securing screw(s) that secures the ultrasonic horn to the bonding arm.

Furthermore, in the present invention,
the bonding arm is provided with a thin-connecting portion which functions as a supporting point; and
the thin-connecting portion is provided
at the same height as a height of a center of gravity of the ultrasonic horn and the ultrasonic horn-connecting portion, and
at a point where a balance between inertial mass including the ultrasonic horn-connecting portion and the ultrasonic horn except the ultrasonic vibrator part and inertial mass of the ultrasonic vibrator part is maintained when the bonding arm is turned about the arm supporting shaft therefor.

In addition, in the present invention, the pressure sensor is comprised of a piezoelectric element or an electrostrictive element.

As seen from the above, in the present invention, a pressure sensor that detects the pressing load applied by the capillary part to a workpiece during bonding action is provided in (a region of) the bonding arm. Accordingly, depending on where the pressure sensor(s) is provided, the magnification factor (ratio) of the capillary's pressing load that is to be detected is different, and thus, there is a great deal of freedom in mechanism designing.

In the present invention, the pressure screw that secures the pressure sensor is a different member from the horn securing screw that secures the ultrasonic bonding horn; and thus in this structure, the pressure sensor can be kept in the bonding arm when the ultrasonic horn is removed from the bonding arm for replacement. Accordingly, disassembly, reassembly, and load calibration of the pressure sensor are not necessary, and thus outstanding work performance is assured.

Furthermore, in the present invention, the pressure screw can function as the horn securing screw. Thus, in this structure, it is possible to monitor the shaft force (internal stress), which is caused by a mounting screw when tightening the mounting screw upon mounting the ultrasonic horn to the bonding arm, by way of directly sensing the shaft force by the pressure sensor, and it is also possible to reduce the number of component parts required.

In addition, in the present invention, the supporting point that acts on the pressure sensor is provided on the center of gravity of the ultrasonic horn and ultrasonic horn-connecting portion, and a thin-connecting portion that acts as the supporting point is provided at a point where a balance between inertial mass including the ultrasonic horn-connecting portion and the ultrasonic horn (excluding the ultrasonic vibrator part) and inertial mass of the ultrasonic vibrator part is maintained, when the bonding arm is turned about the arm supporting shaft therefor. Accordingly, vibration that would occur when the bonding apparatus is operated at high speed in the driving direction thereof which is in XYZ directions and in particular in YZ directions can be reduced, and loads undesirable to the control of the bonding apparatus are prevented from being applied to the pressure sensor.

DETAILED DESCRIPTION OF THE INVENTION

Figure 1A:
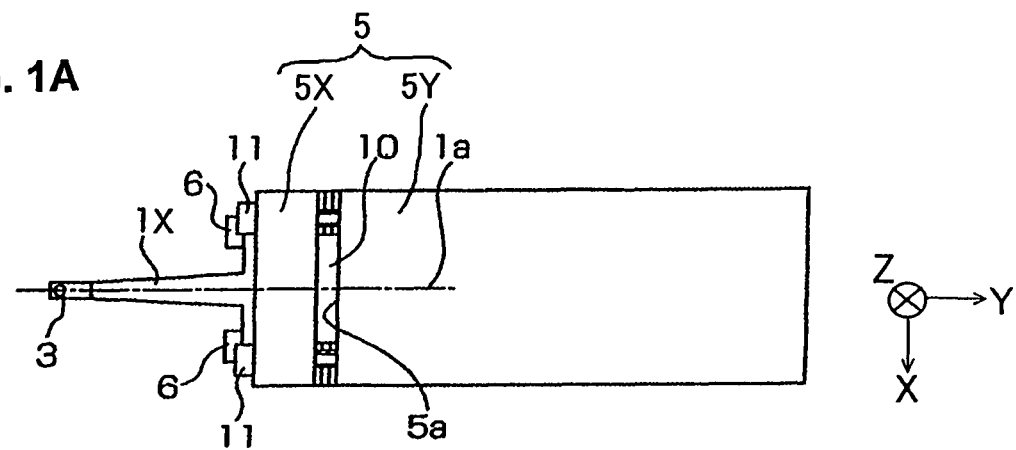
FIG. 1A is a top view of the first embodiment of the wire bonding apparatus according to the present invention, FIG. 1B being a partially cross-sectional side view thereof, and FIG. 1C being a bottom plan view thereof.

The first embodiment of the wire bonding apparatus of the present invention will be described with reference to FIGS. 1A to 1C.

The ultrasonic horn 1 used in the wire bonding apparatus of the present invention is comprised of a capillary 3, an ultrasonic horn body portion 1X and an ultrasonic vibrator 4. The capillary 3 through which a wire 2 passes is secured at one end of the ultrasonic horn body portion 1X; and at the other end of the ultrasonic horn body portion 1X, an ultrasonic vibrator 4 for ultrasonically vibrating the capillary 3 is secured. The ultrasonic horn 1 is secured to one end (tip end) of a bonding arm 5 by horn securing screws 6, and the bonding arm 5 is mounted to a wire bonder (not shown) by being supported by an arm supporting shaft 7 so that the bonding arm 5 can freely swing in a vertical direction about the arm supporting shaft 7. The bonding arm 5 is comprised of an ultrasonic horn-connecting portion 5X and a bonding arm main body 5Y. Furthermore, though not shown in the drawings, the other end (root end) of the bonding arm 5 is connected to a linear motor, so that the bonding arm 5 is driven up and down by this linear motor.

In the bonding arm 5, a sensor hole 5a for installing a pressure sensor 10 therein is formed in the upper surface. The pressure sensor 10 is installed in the sensor hole 5a, and this pressure sensor 10 provided in the sensor hole 5a is secured by pressure screws 11 to the bonding arm 5. In the bonding arm 5, slits 5c and 5d are formed. The slit 5c, or the upper slit 5c, extends downward from the sensor hole 5a; and the slit 5d, or the lower slit 5d, extends upward from the lower surface of the bonding arm 5. These slits 5c and 5d provide a supporting point 5b in between, which is a thin-connecting portion, so that the supporting point (thin-connecting portion) 5b is located at the same height as the height of the center of gravity of a part formed by the capillary 3, ultrasonic horn body portion 1X, ultrasonic vibrator 4, ultrasonic horn-connecting portion 5X, horn securing screws 6 and pressure screws 11 and on a line on which a balance between inertial mass including the capillary 3, ultrasonic horn body part 1X, ultrasonic horn-connecting portion 5X, horn securing screws 6 and pressure screws 11 and inertial mass of the ultrasonic vibrator 4 is maintained and under the pressure sensor 10, when the bonding arm 5 turns (swings) about the arm supporting shaft 7.

In the above-described structure, when the wire 2 is pressed against a bond point 8 (see FIG. 1B) on a workpiece, this pressing load is transmitted through the capillary 3 and the ultrasonic horn 1 to the bonding arm 5. Since the supporting point 5b in the bonding arm 5 is thin (to form a thin-connecting portion), a pressure acts on the pressure sensor 10 due to the deformation of this supporting point 5b caused by the pressing load transmitted thereto, and thus, the pressure sensor 10 detects the pressing load and outputs a detection signal. As a result, as in the conventional bonding apparatus, a motor for driving the bonding arm 5 up and down is controlled thereby, providing a pressing load of a prescribed value. The pressure sensor 10 is comprised of a piezoelectric element or an electrostrictive element.

As seen from the above, since the pressure sensor 10 is provided inside (a region of) the bonding arm 5 by the pressure screws 11, the pressure sensor 10 can remain in the sensor hole 5a of the bonding arm 5 when the ultrasonic horn 1 is removed from the bonding arm 5 to be replaced with, for instance, a new ultrasonic horn. Accordingly, replacement of the ultrasonic horn 1 will not require removal and installation (reinstallation) of the pressure sensor 10 (or disassembly and reassembly thereof) or a load calibration (pressure adjustment) thereof, thus providing outstanding work performance.

Figure 1B:
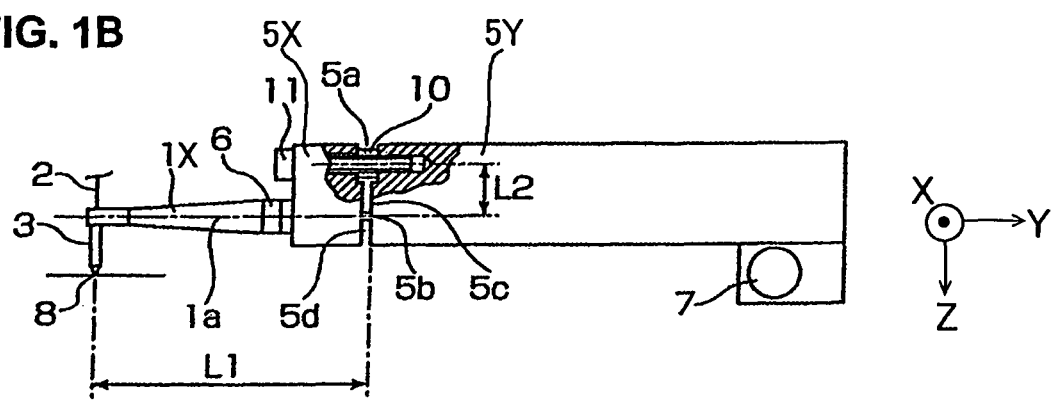
Figure 1C:
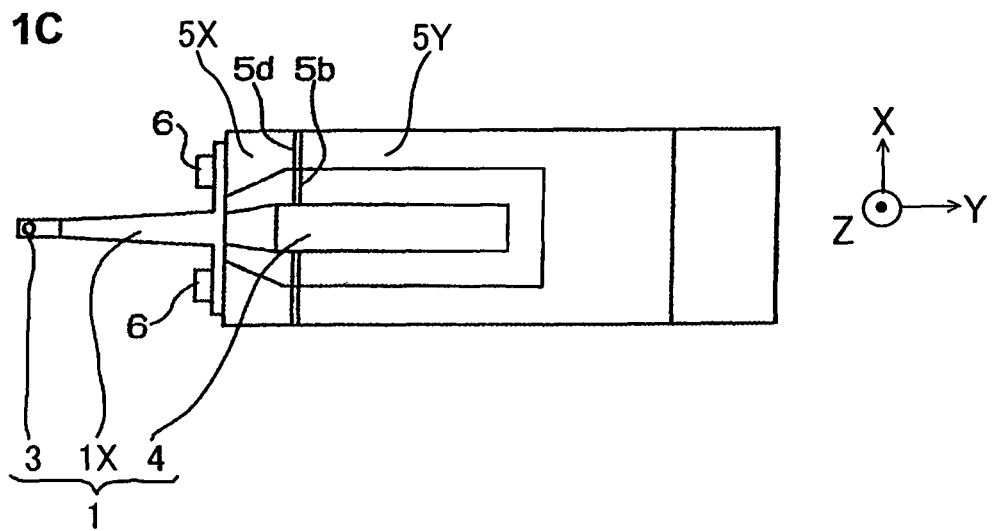

Furthermore, in the above-described structure, the load from the capillary 3 is magnified by the ratio L1/L2 between, as seen from FIG. 1B, the distance L1 which is from the capillary 3 to the supporting point 5b and the distance L2 which is from the supporting point 5b to the center part of the pressure sensor 10. Accordingly, the load from the capillary 3 can be sensed in large values by the pressure sensor 10 in response to the input of the load from the capillary 3, and precision load control becomes easy. Furthermore, the supporting point 5b is set at the same height as the height of the center of gravity of a part formed by the capillary 3, ultrasonic horn body portion 1X, ultrasonic vibrator 4, ultrasonic horn-connecting portion 5X, horn securing screws 6 and pressure screws 11 and at a part where the balance between inertial mass including the capillary 3, ultrasonic horn body part 1X, ultrasonic horn-connecting portion 5X, horn securing screws 6 and pressure screws 11 and inertial mass of the ultrasonic vibrator 4 is maintained, when the bonding arm 5 is turned (or swung) about the arm supporting shaft 7. Accordingly, vibrations can be suppressed even when the ultrasonic horn, which is a part of the bonding apparatus and includes a bonding arm and a capillary, is operated at high speed in the driving direction thereof which is in XYZ directions and in particular in YZ directions. In addition, loads undesirable to the control of the bonding apparatus are prevented from being applied to the pressure sensor.

Figure 2A:
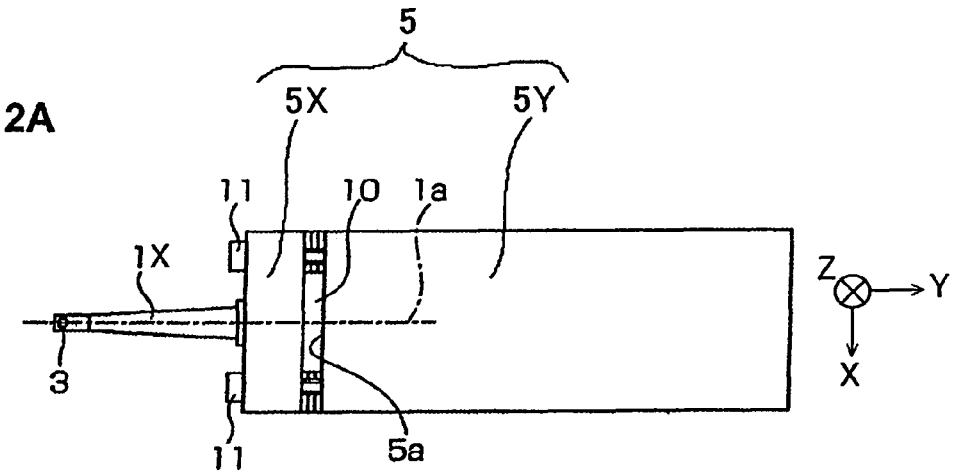
FIG. 2A is a top view of the second embodiment of the wire bonding apparatus according to the present invention, FIG. 2B being a partially cross-sectional side view thereof, and FIG. 2C being a bottom plan view thereof.
Figure 2B:
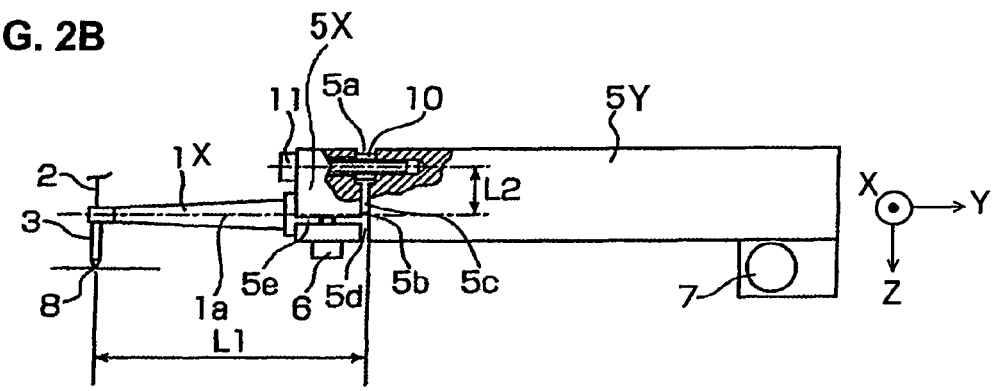
Figure 2C:
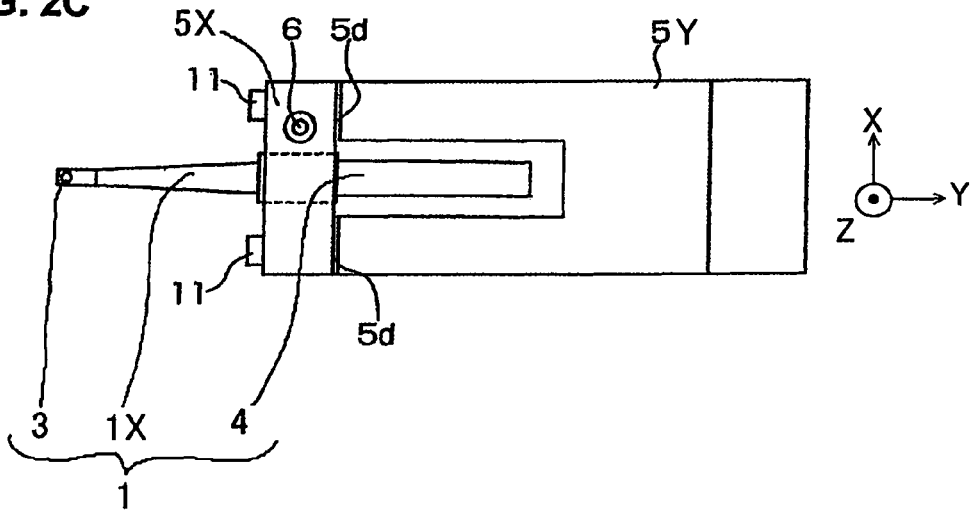

FIGS. 2A through 2C show the second embodiment of the wire bonding apparatus of the present invention. This embodiment differs from the above-described first embodiment only in the structure for attaching the ultrasonic horn 1 to the bonding arm 5. The members and parts that are the same as or equivalent to those in the above-described embodiment are thus designated by the same symbols, and no detailed description thereof will be provided.

In the bonding arm 5 of FIGS. 2A through 2C, a dividing channel 5e is formed so that it extends from the side of the front surface of the portion of the attachment hole for attaching the ultrasonic horn 1, and the ultrasonic horn 1 is secured to the bonding arm 5 by tightening the horn securing screw 6. The present invention is applicable to such a structure as this; and needless to say, the same advantages as that with the above-described embodiment are obtainable.

Figure 3A:
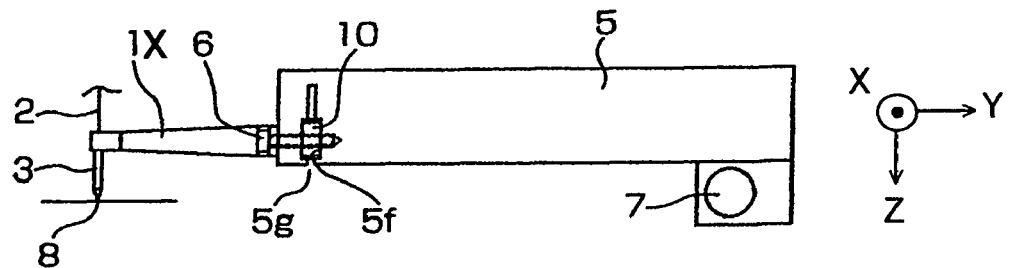
FIG. 3A is a side view of the third embodiment of the wire bonding apparatus according to the present invention, FIG. 3B being a partially cross-sectional side view thereof, and FIG. 3C being a bottom plan view thereof.
Figure 3B:
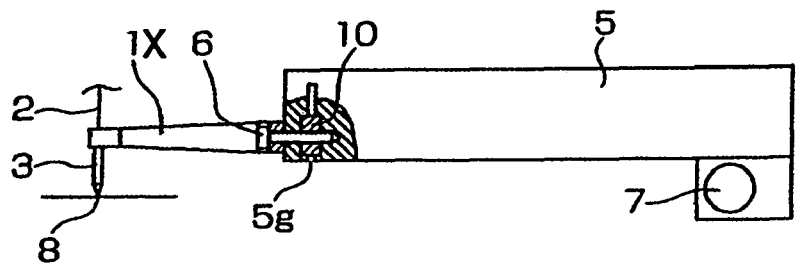
Figure 3C:
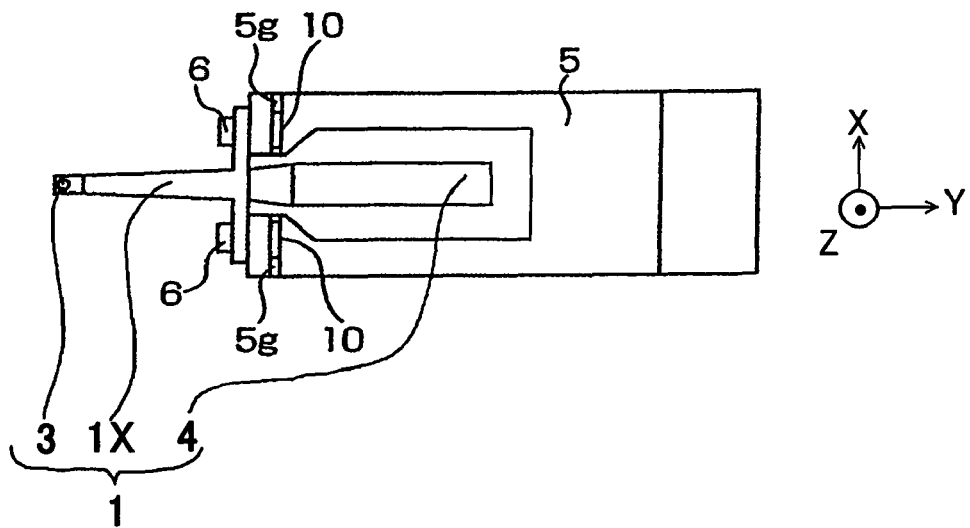

FIGS. 3A through 3C show the third embodiment of the wire bonding apparatus of the present invention, and it will be described with reference to FIGS. 3A through 3C. The members and parts that are the same as or equivalent to those in the first and second embodiment are designated by the same symbols, and no detailed description thereof will be provided.

Sensor holes 5f into which the pressure sensors 10 are respectively inserted are respectively formed in two side surfaces of the bonding arm 5 that correspond to the horn securing screws 6, and pressure sensors 10 provided in the sensor holes 5f are respectively secured by horn securing screws 6 to the bonding arm 5. In other words, in this embodiment, the horn securing screws 6 for securing the ultrasonic horn 1 to the bonding arm 5 function also as pressure screws that secure the pressure sensors 10 to the bonding arm 5. Furthermore, slits 5g are formed to extend from two areas in the lower surface of the bonding arm 5, which respectively correspond to the sensor holes 5f, to above the sensor holes 5f.

In this embodiment as well, the pressing load of the capillary 3 is transmitted by the capillary 3 and ultrasonic horn 1 to the bonding arm 5, and such a pressing load is detected by distortions that occur in the pressure sensors 10.

It should be noted that generally when securing an ultrasonic horn to a bonding arm, tightening is done while controlling the torque by a torque wrench. In the shown embodiment, however, since the horn securing screws 6 function also as pressure screws for securing the pressure sensor 10 to the bonding arm 5, such control can be done, when tightening the horn securing screws 6, while directly sensing the shaft force (internal stress) of the horn securing screws 6 by the pressure sensors 10. Furthermore, since the horn securing screws 6 function also (or is used also) as pressure screws for securing the pressure sensors 10, the number of parts can be reduced. In addition, even if the ultrasonic horn 1 is removed from the bonding arm 5 so as to replace the ultrasonic horn 1, the pressure sensors 10 can be kept in the sensor holes 5f of the bonding arm 5; and thus, assembly is done easily, and outstanding work performance is assured.

Figure 4A:
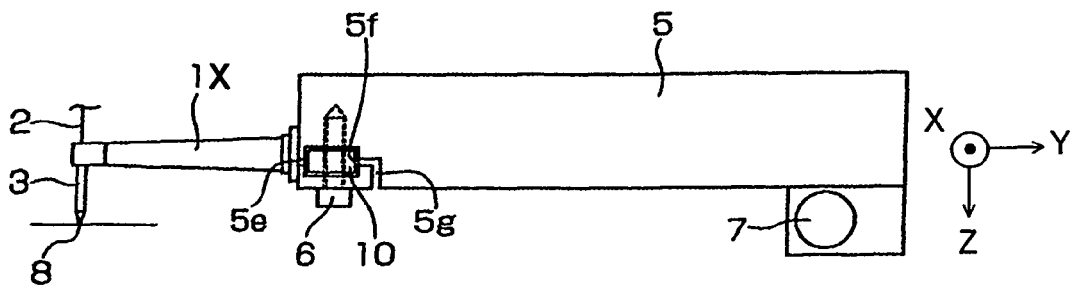
FIG. 4A is a side view of the fourth embodiment of the wire bonding apparatus according to the present invention, FIG. 4B being a partially cross-sectional side view thereof, and FIG. 4C being a bottom plan view thereof.
Figure 4B:
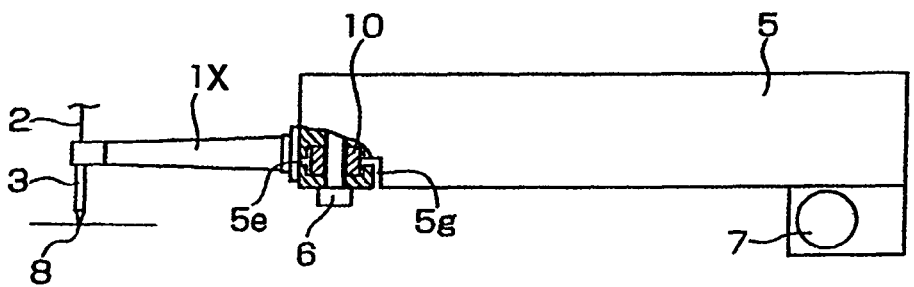
Figure 4C:
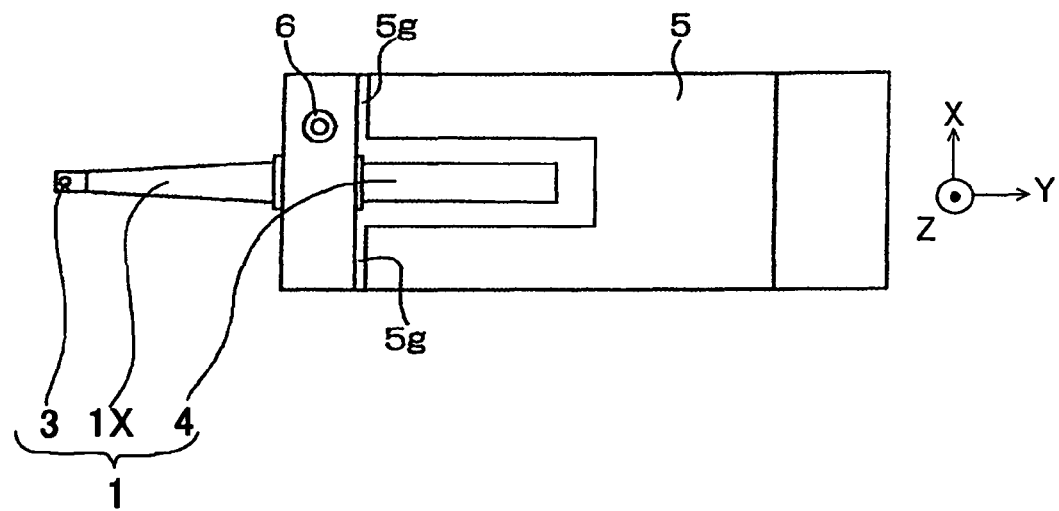
Figure 5A:
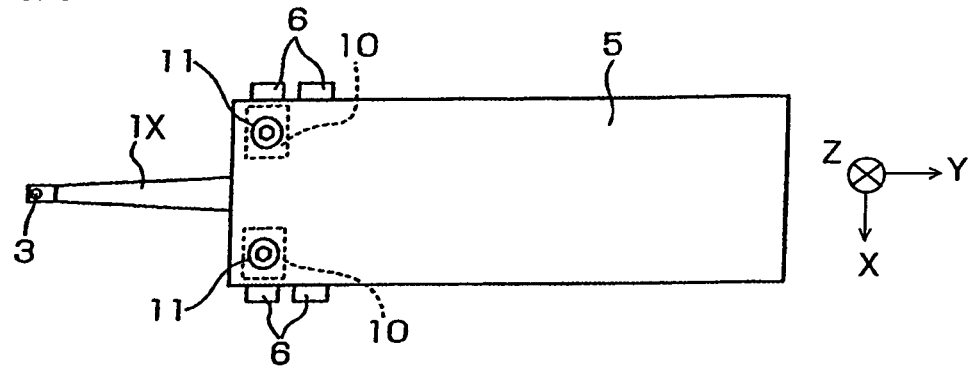
FIG. 5A is a top view of the fifth embodiment of the wire bonding apparatus according to the present invention, FIG. 5B being a side view thereof, FIG. 5C being a partially cross-sectional side view thereof, and FIG. 5D being a bottom plan view thereof.
Figure 5B:
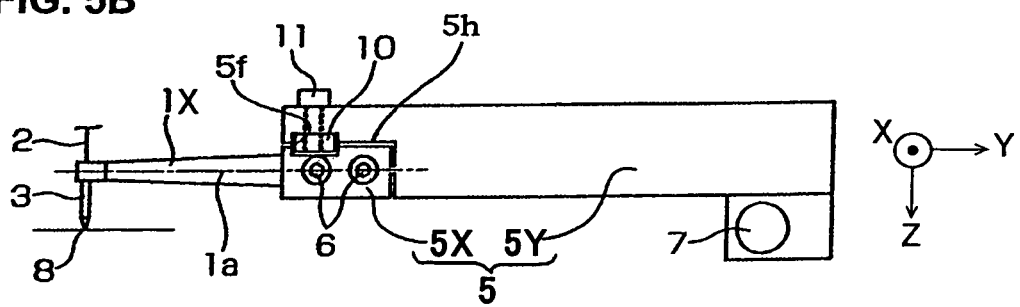
Figure 5C:
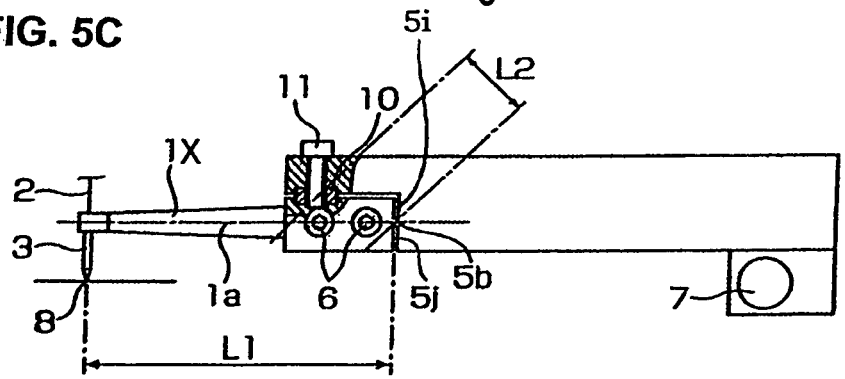
Figure 5D:
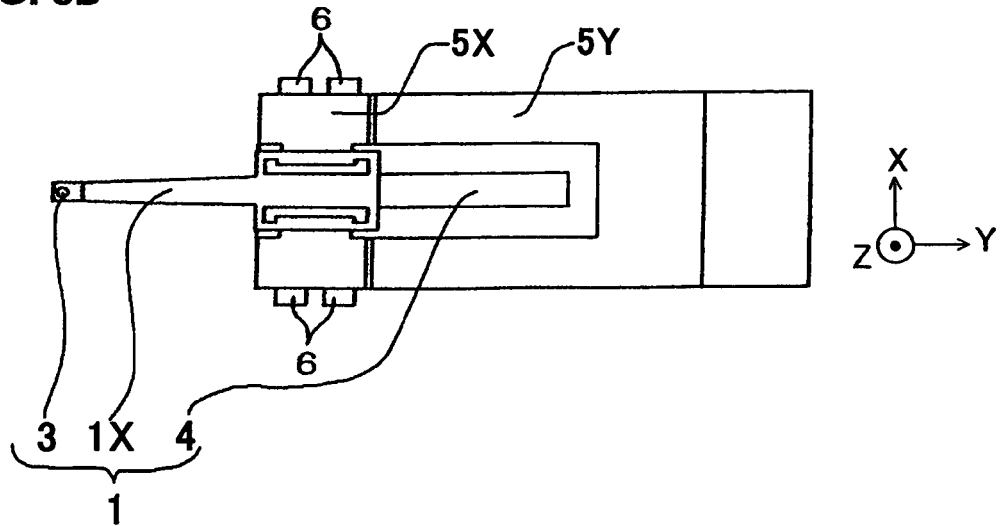
Figure 6:
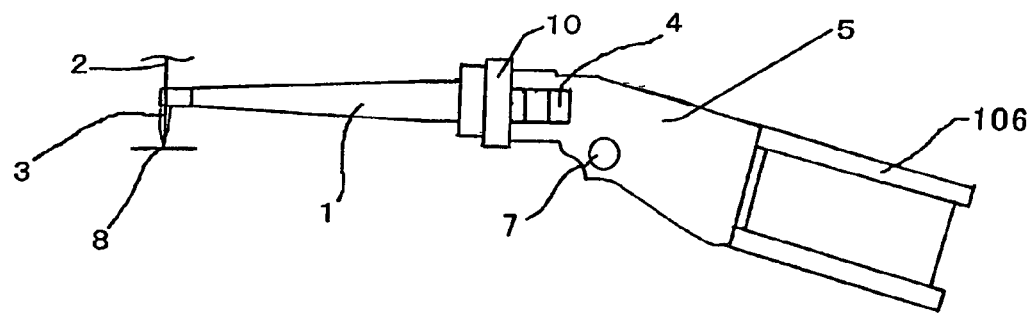
FIG. 6 illustrates a conventional bonding apparatus that is capable of detecting a pressing load of a capillary thereof.
Figure 7:
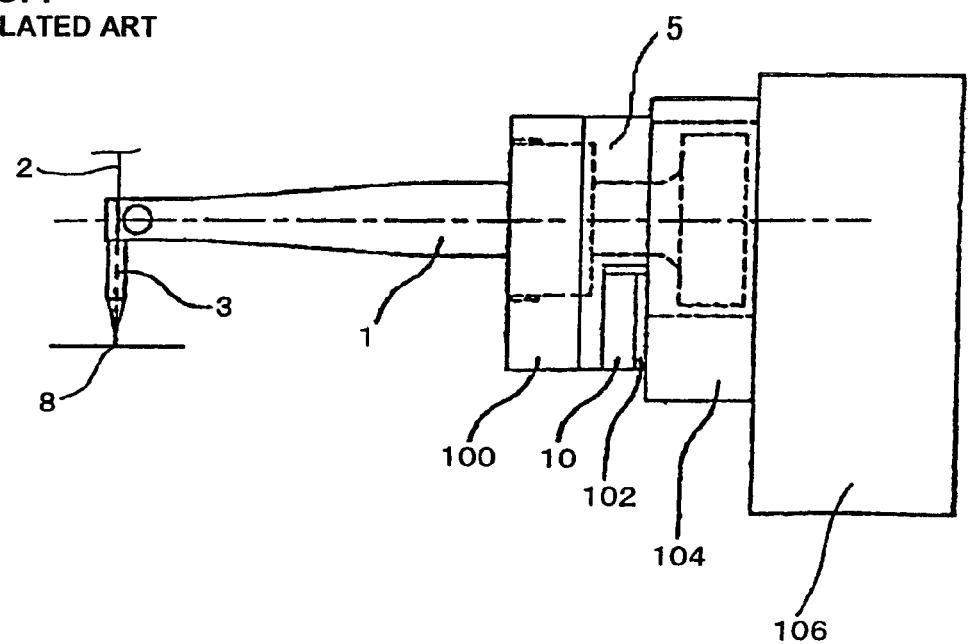
FIG. 7 illustrates another conventional bonding apparatus that is capable of detecting a pressing load of a capillary thereof.

The fourth embodiment of the wire bonding apparatus of the present invention will be described below with reference to FIGS. 4A through 4C. In this embodiment, the manner of securing the ultrasonic horn 1 to the bonding arm 5 is the same as in the above-described second embodiment. The members and parts that are the same as or equivalent to those in the embodiments described above are thus designated by the same symbols, and no detailed description thereof will be provided.

More specifically, a dividing channel(s) 5e is formed in the portion of the attachment hole for attaching the ultrasonic horn 1 in the bonding arm 5, to extend from the side of the front surface, and the ultrasonic horn 1 is secured to the bonding arm 5 by tightening the horn securing screw(s) 6. The manner of attaching the pressure sensor(s) 10 to the bonding arm 5 is the same as in the third embodiment. In other words, a sensor hole(s) 5f wherein the pressure sensor(s) 10 can be inserted is formed in the side surface of the bonding arm 5 so as to correspond to the horn securing screw(s) 6, and the pressure sensor 10(s) is provided in this sensor hole(s) 5f and is secured by the horn securing screw(s) 6 to the bonding arm 5. Accordingly, in this embodiment, the horn securing screw(s) 6 that secures the ultrasonic horn 1 to the bonding arm 5 functions also as a pressure screw(s) that secures the pressure sensor(s) 10 to the bonding arm 5. Furthermore, slits 5g are formed to extend from two areas of the lower surface of the bonding arm 5 that correspond to the sensor hole(s) 5f to above the dividing channel(s) 5e. Accordingly, in this embodiment also, the same benefits as in the above-described third embodiment are obtained.

The fifth embodiment of the wire bonding apparatus of the present invention will be described with reference to FIGS. 5A through 5D.

In the above-described first and third embodiments, the ultrasonic horn 1 is secured to the bonding arm 5 by the horn securing screws 6 from the front surface of the bonding arm 5; and in each one of the second and fourth embodiments, the ultrasonic horn 1 is secured to the bonding arm 5 by the horn securing screw 6 from the lower surface of the bonding arm 5. In the fifth embodiment shown in FIGS. 5A through 5D, the ultrasonic horn 1 is secured to the bonding arm 5 by horn securing screws 6 mounted on both side surfaces of the bonding arm 5. The members and parts that are the same as or equivalent to those in the embodiments above are thus designated by the same symbols, and no detailed description thereof will be provided.

More specifically, in this fifth embodiment, sensor holes 5f, into which the pressure sensors 10 are respectively inserted, are formed respectively, as in the third embodiment, in two portions of the side surfaces of the bonding arm 5 that are located above the horn securing screws 6, and pressure sensors 10 are provided in these sensor holes 5f and are secured respectively by pressure screws 11 to the bonding arm 5. Furthermore, in portions corresponding to the sensor holes 5f, horizontal slits 5h are formed, from the front surface of the bonding arm 5 passing the sensor holes 5f. Furthermore, vertical slits 5i and 5j are formed for the slits 5h. More specifically, for each one of pressure sensors 10, vertical slits 5i and 5j are provided. The vertical slit 5i, or the upper slit 5i, extends downward from one of the horizontal slits 5h; and the vertical slit 5j, or the lower slit 5j, extends upward from the lower surface of the bonding arm 5. These vertical slits 5i and 5j provide a supporting point 5b in between, which is a thin-connecting portion, so that the supporting point (thin-connecting portion) 5b is provided at the same height as the height of the center of gravity of a part formed by the capillary 3, ultrasonic horn body portion 1X, ultrasonic vibrator 4, ultrasonic horn-connecting portion 5X and horn securing screws 6 and on a line on which a balance between inertial mass including the capillary 3, ultrasonic horn body part 1X, ultrasonic horn-connecting portion 5X and horn securing screws 6 and inertial mass of the ultrasonic vibrator 4 is maintained and below the slit 5h, when the bonding arm 5 turns (swings) about the arm supporting shaft 7.

In the above-described structure, when the wire 2 is pressed against a bond point 8 (see FIG. 5C) on a workpiece, as in the first embodiment, this pressing load is transmitted by the capillary 3 and ultrasonic horn 1 to the bonding arm 5. Sine the supporting points 5b of the bonding arm 5 are constituted by the thin-connecting portions, the pressure acts on the pressure sensors 10 by the deformation of the supporting points 5b, and the pressure sensors 10 detect the pressing load and output a detection signal.

In this fifth embodiment as well, as in the first embodiment, the pressure sensors 10 are secured inside (regions of) the bonding arm 5 by pressure screws 11. Accordingly, even if the ultrasonic horn 1 is removed from the bonding arm 5 so as to, for instance, be replaced with a new ultrasonic horn, the pressure sensors 10 remain in the sensor holes 5f of the bonding arm 5. As a result, even if the ultrasonic horn 1 is replaced, there is no need to remove and then reinstall the pressure sensor 10 or perform load calibration (pressure adjustment) thereof, thus providing outstanding work performance.

Furthermore, the load from the capillary 3 is magnified by the ratio L1/L2 between the distance L1 which is from the capillary 3 to the supporting points 5b and the distance L2 which is from the supporting points 5b to the center part of the pressure sensor 10. Accordingly, the load from the capillary 3 can be sensed in large values by the pressure sensors 10 in response to the input of the load from the capillary 3, and precision load control becomes easy. Furthermore, the respective supporting points 5b is set at the height same as the height of the center of gravity of a part formed by the capillary 3, ultrasonic horn body portion 1X, ultrasonic vibrator 4, ultrasonic horn-connecting portion 5X and horn securing screws 6 and at a location where a balance between inertial mass including the capillary 3, ultrasonic horn body part 1X, ultrasonic horn-connecting portion 5X and horn securing screws 6 and inertial mass of the ultrasonic vibrator 4 is maintained, when the bonding arm 5 is turned (or swung) about the arm supporting shaft 7. Accordingly, vibrations can be suppressed even when the ultrasonic horn, which is a part of the bonding apparatus and includes the bonding arm and the capillary, is operated at high speed in the driving direction thereof which is in XYZ directions and in particular in YZ directions. Needless to say, in the fifth embodiment, not only the bonding load detection but also the grounding detection which is to detect the capillary 3 grounding (moving down to contact) the bond point 8 can be both performed.

The invention claimed is:

1. A wire bonding apparatus comprising:
   an ultrasonic horn including a capillary part, an ultrasonic vibrator part, and an ultrasonic horn body portion, the ultrasonic horn body portion being securely-fixed to the capillary part at one end thereof and to the ultrasonic vibrator part at another end thereof;
   a bonding arm including an ultrasonic horn-connecting portion for fixing securely the ultrasonic horn thereto;
   a bonding arm body portion provided between the ultrasonic horn-connecting portion and an arm supporting shaft therefor;
   a pressure sensor for detecting a pressing load applied by the capillary part, the pressure sensor being provided within the bonding arm;
   the bonding arm being provided with a thin-connecting portion which functions as a supporting point; and
   the thin-connecting portion being provided
       at the same height as a height of a center of gravity of the ultrasonic horn and the ultrasonic horn-connecting portion, and
       at a point where a balance between inertial mass including the ultrasonic horn-connecting portion and the ultrasonic horn except the ultrasonic vibrator part and inertial mass of the ultrasonic vibrator part is maintained when the bonding arm is turned about the arm supporting shaft therefor.

2. A wire bonding apparatus comprising:
   an ultrasonic horn including a capillary part, an ultrasonic vibrator part, and an ultrasonic horn body portion, the ultrasonic horn body portion being securely-fixed to the capillary part at one end thereof and to the ultrasonic vibrator part at another end thereof;
   a bonding arm including an ultrasonic horn-connecting portion for fixing securely the ultrasonic horn thereto;
   a bonding arm body portion provided between the ultrasonic horn-connecting portion and an arm supporting shaft therefor;
   a pressure sensor for detecting a pressing load applied by the capillary part, the pressure sensor being provided within the bonding arm;
   the bonding arm being formed with a sensor hole in an upper surface thereof so as to have the pressure sensor therein;
   the pressure sensor being provided in the sensor hole and securely-fixed by a pressure screw to the bonding arm;
   the bonding arm being provided with a thin-connecting portion which functions as a supporting point; and
   the thin-connecting portion being provided
       at the same height as a height of a center of gravity of the ultrasonic horn and the ultrasonic horn-connecting portion, and
       at a point where a balance between inertial mass including the ultrasonic horn-connecting portion and the ultrasonic horn except the ultrasonic vibrator part and inertial mass of the ultrasonic vibrator part is maintained when the bonding arm is turned about the arm supporting shaft therefor.

3. A wire bonding apparatus comprising:
   an ultrasonic horn including a capillary part, an ultrasonic vibrator part, and an ultrasonic horn body portion, the ultrasonic horn body portion being securely-fixed to the capillary part at one end thereof and to the ultrasonic vibrator part at another end thereof;
   a bonding arm including an ultrasonic horn-connecting portion for fixing securely the ultrasonic horn thereto;
   a bonding arm body portion provided between the ultrasonic horn-connecting portion and an arm supporting shaft therefor;
   a pressure sensor for detecting a pressing load applied by the capillary part, the pressure sensor being provided within the bonding arm;
   the bonding arm being formed with a sensor hole in a side surface thereof so as to have the pressure sensor therein;
   the pressure sensor being provided in the sensor hole and securely-fixed by a pressure screw to the bonding arm;
   the bonding arm being provided with a thin-connecting portion which functions as a supporting point; and
   the thin-connecting portion being provided
       at the same height as a height of a center of gravity of the ultrasonic horn and the ultrasonic horn-connecting portion, and
       at a point where a balance between inertial mass including the ultrasonic horn-connecting portion and the ultrasonic horn except the ultrasonic vibrator part and inertial mass of the ultrasonic vibrator part is maintained when the bonding arm is turned about the arm supporting shaft therefor.

4. The wire bonding apparatus according to claim 1, wherein the pressure sensor is one of a piezoelectric element and an electrostrictive element.

5. The wire bonding apparatus according to claim 2, wherein the pressure sensor is one of a piezoelectric element and an electrostrictive element.

6. The wire bonding apparatus according to claim 3, wherein the pressure sensor is one of a piezoelectric element and an electrostrictive element.

* * * * *